United States Patent
Yudahira et al.

(10) Patent No.: US 6,664,761 B2
(45) Date of Patent: Dec. 16, 2003

(54) BATTERY VOLTAGE DETECTION DEVICE

(75) Inventors: Hirofumi Yudahira, Shizuoka (JP); Naohisa Morimoto, Aichi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 0 days.

(21) Appl. No.: 10/159,617

(22) Filed: May 29, 2002

(65) Prior Publication Data

US 2003/0052688 A1 Mar. 20, 2003

(30) Foreign Application Priority Data

May 29, 2001 (JP) .......................................... 2001-161472

(51) Int. Cl.[7] .............................................. H01M 10/46
(52) U.S. Cl. ........................................ 320/116; 320/122
(58) Field of Search ................................. 320/116, 118, 320/119, 120, 121, 122, 123

(56) References Cited

U.S. PATENT DOCUMENTS 5,744,936 A * 4/1998 Kawakami
5,898,291 A * 4/1999 Hall
6,236,215 B1 5/2001 Kanehira

FOREIGN PATENT DOCUMENTS

| DE | 196 18 897 | 11/1997 |
|---|---|---|
| JP | 10-253726 | 9/1998 |
| JP | 2001-201522 | 7/2001 |

OTHER PUBLICATIONS

Copy of European Search Report dated Sep. 25, 2002.

* cited by examiner

*Primary Examiner*—Edward H. Tso
(74) *Attorney, Agent, or Firm*—Snell & Wilmer, LLP

(57) ABSTRACT

A battery voltage detection device includes: a plurality of (N+1) voltage detection terminals connected to the plurality of N battery blocks; a first plurality of switches each having an inter-terminal capacitance, the plurality of switches being connected to the respective voltage detection terminals connected to the battery blocks; a second switch having an inter-terminal capacitance, to which the first plurality of switches are collectively connected, the first plurality of switches being connected to odd-numbered voltage detection terminals; a third switch having an inter-terminal capacitance, to which the first plurality of switches are collectively connected; a pair of fourth switches connected in series to the second switch and the third switch; and a capacitor provided between the connection point of the second switch and one of the fourth switches, and the connection point of the third switch and the other of the fourth switches.

6 Claims, 3 Drawing Sheets

BATTERY VOLTAGE DETECTION DEVICE

BACKGROUND OF THE INVENTION

1. Field of the Invention

The present invention relates to a battery voltage detection device suitably used for measuring a low impedance voltage which is not earthed; for example, the voltage of a battery mounted as a power supply for a motor on an electric vehicle, hybrid electric vehicle, or the like.

2. Description of the Related Art

In an electric vehicle, a hybrid electric vehicle, or the like, a motor is mounted as a power source. A battery is used as an electric power supply for the motor. Such a battery requires a high voltage and a high power output. Therefore, a battery pack including a plurality of serially-connected battery cells is used as the battery for driving the motor. Usually, rechargeable secondary batteries are used as the battery cells. Since a battery pack used in an electric vehicle requires a high voltage, the battery pack is mounted on a vehicle so as to be isolated from the chassis earth for safety reasons.

In the electric vehicle, a battery voltage detection device is provided for monitoring the occurrence of malfunctions in the battery pack. The battery voltage detection device detects the voltage of each battery block which includes a plurality of battery cells as one unit. FIG. 3 shows an exemplary structure of such a battery voltage detection device.

In FIG. 3, a battery pack 11 includes a plurality of battery blocks 11a. A plurality of voltage detection terminals 12 are provided between the battery blocks 11a. Each voltage detection terminal 12 is connected to a respective one of a first plurality of FETs (field-effect transistors) 43, which is a first switching element. Each of the first plurality of FETs 43 forms an SSR (solid-state relay). Some of the first plurality of FETs 43, which are connected to the odd-numbered voltage detection terminals 12 in the battery pack 11, are together connected to one terminal of a capacitor 46 and to a second FET 45a which is a second switching element. The remainder of the first plurality of FETs 43, which are connected to the even-numbered voltage detection terminals 12 in the battery pack 11, are together connected to the other terminal of the capacitor 46 and to a third FET 45b which is a third switching element.

The second FET 45a and the third FET 45b are connected to respective input terminals of a differential amplifier 20. The differential amplifier 20 includes a first operational amplifier 21. The second FET 45a is connected to a positive input terminal of the first operational amplifier 21 via a first resistor 22a. The third FET 45b is connected to a negative input terminal of the first operational amplifier 21 via a second resistor 22b. The positive input terminal of the first operational amplifier 21 receives, via a third resistor 22c, the output of a second operational amplifier 23 which generates a reference voltage. The output of the first operational amplifier 21 is fed back to the negative terminal of the first operational amplifier 21 via a fourth resistor 22d. The output of the first operational amplifier 21 is output to an A/D converter 30 as the output of the differential amplifier 20.

A voltage dividing circuit 24 is a series circuit formed by resistors 24a and 24b. The potential of the connection point of the resistors 24a and 24b is input to the positive input terminal of the second operational amplifier 23. The output of the second operational amplifier 23 is fed back to the negative input terminal of the second operational amplifier 23.

In a battery voltage detection device having such a structure, the voltages of the battery blocks 11a in the battery pack 11 are detected in turn by the differential amplifier 20.

In the first step of the voltage detection process, the second FET 45a and the third FET 45b connected to the differential amplifier 20 are turned off. Then, a first FET of the first plurality of FETs 43, which is connected to the first voltage detection terminal 12 in the battery pack 11, and a second FET of the first plurality of FETs 43, which is connected to the second voltage detection terminal 12 in the battery pack 11, are turned on. Thus, the first battery block 11a is connected to the capacitor 46, and charges the capacitor 46.

After the capacitor 46 has been charged, the pair of the FETs 43 are turned off, and then the second FET 45a and the third FET 45b are turned on. Thus, the voltage of the capacitor 46 is applied to the differential amplifier 20.

In the differential amplifier 20, a reference voltage of 2.5 V is applied from the second operational amplifier 23 to the positive input terminal of the first operational amplifier 21 via the third resistor 22c. Therefore, the voltage of the capacitor 46, which has been input to the differential amplifier 20, is detected within a range up to 5 V from a reference of 2.5 V.

Similarly, while the second FET 45a and the third FET 45b are off, the first FETs 43 connected to the second voltage detection terminal 12 and the third voltage detection terminal 12 are turned on, so that the capacitor 46 is charged with the second battery block 11a. Then, the first FETs 43 are turned off, and the second FET 45a, and the third FET 45b are turned on. Thus, the voltage of the second battery block 11a in the battery pack 11 is detected.

In this case, the polarity of the voltage which has been input to the first operational amplifier 21 of the differential amplifier 20 is opposite to that of the first battery block 11a. Therefore, the first operational amplifier 21 detects the voltage of the second battery block 11a within a range down to 0 V from a reference of 2.5 V.

Subsequently, the voltages of the other battery blocks 11a are detected in turn in a similar manner.

Although the voltages having the opposite polarities are input in turn from the battery blocks 11a forming the battery pack 11 to the differential amplifier 20, the voltages are detected without switching the polarity of the reference potential of the first operational amplifier 21. The detected voltages of the battery blocks 11a are input to the A/D converter 30. In the A/D converter 30, input voltages are A/D converted, and then output to a computing unit, such as a CPU.

However, in such a battery voltage detection device, each of the first plurality of FETs 43, which forms an SSR, has an inter-terminal capacitance. This inter-terminal capacitance may cause problems in the detection of the voltages of the battery blocks 11a. Specifically, in order to detect the voltage of one of the battery blocks 11a, a pair of first plurality of FETs 43 connected to voltage detection terminals 12 of this battery block 11a are turned on, then the capacitor 46 obtains a voltage value substantially equal to that of the connected battery block 11a. However, when each of the first plurality of FETs 43 is turned off, each of the first plurality of FETs 43 is charged with an electric charge of the capacitor 46, because each of the first plurality of FETs 43 has inter-terminal capacitance. Therefore, the voltage value of the capacitor 46 may vary. As a result, the voltages of the battery blocks 11a may not be detected with high precision.

Furthermore, when the number of the battery blocks 11a in the battery pack 11 is an even number, the number of the first plurality of FETs 43 connected to respective terminals of the capacitor 46 are different. In the case of detecting a voltage of an even-numbered battery block 11a, the number of the first plurality of FETs 43 connected to the capacitor 46 is increased by one, in comparison to the number of the first plurality of FETs 43 in the case of detecting a voltage of an odd-numbered battery block 11a. Thus, there is a difference in the inter-terminal capacitances connected to the capacitor 46 between the case of detecting the voltage of the odd-numbered battery block 11a and the case of detecting the voltage of the even-numbered battery block 11a. As a result, the voltages of the battery blocks 11a may not be detected with a high precision.

In this case, by making the capacitance of the capacitor 46 sufficiently larger than those of the first plurality of FETs 43, variation in the voltage of the capacitor 46 can be suppressed. However, as the capacitance increases, the capacitor 46 becomes more expensive. Thus, cost-effectiveness is reduced in such a case. Furthermore, as the number of the battery blocks 11a increases, the number of lines connected to the capacitor 46 increases, and thus, the number of first plurality of FETs 43 connected in parallel to the capacitor 46 increases. Thus, since the total capacitance connected to the capacitor 46 increases, the capacitance of the capacitor 46 effectively increases and the variation in the voltage of the capacitor 46 may not be suppressed.

Further still, as described above, a battery pack 11 used in an electric vehicle is mounted so as to be isolated from the chassis earth. That is, the battery pack 11 is connected to the chassis earth with a large impedance. The output of the battery pack 11 varies with respect to the chassis earth depending upon the magnitude of the load on the battery pack 11, and as a result, a common mode noise may be generated. This common mode noise affects the inter-terminal capacitances of the first plurality of FETs 43, and may affect the voltage to be charged in the capacitor 46. Thus, the precision in detection of the voltages of the battery blocks 11a decreases.

In order to prevent such influences caused by the common mode noise, the differential amplifier 20 may be used for controlling the output of the battery pack 11. However, in this case, the battery pack installed so as to be isolated from the chassis earth requires an isolated-type, DC-to-DC differential amplifier. Therefore, the number of components is increased, the circuit arrangement becomes complicated, and the cost-effectiveness is reduced.

When the amplifier is provided in the battery pack 11, the first plurality of FETs 43 having different inter-terminal capacitances are connected between the differential amplifier and the capacitor 46. Therefore, due to the different impedances of each of the first plurality of FETs 43, a new common mode noise may be generated, and the voltages of the battery blocks 11a may not be detected with a high precision.

In the differential amplifier 20 to which the voltage of the capacitor 46 is input, the gain can be changed by varying resistance values of the first resistor 22a to the fourth resistor 22d, and the offset can be changed by varying the reference potential of the first operational amplifier 21. Therefore, such a differential amplifier 20 is suitable for measuring a low impedance analog voltage which has an unfixed potential. Furthermore, the common mode noise can be suppressed in an increased proportion.

However, the characteristics of the operational amplifiers and the resistors, which form the differential amplifier 20, may vary due to variation in temperature or deterioration with the passage of time. In view of such circumstances, operational amplifiers or resistors having characteristics more resistant to temperature variation may be used. However, such operational amplifiers and resistors are expensive and reduce cost-effectiveness.

SUMMARY OF THE INVENTION

According to one aspect of the present invention, there is provided a battery voltage detection device for detecting voltages of battery blocks in a battery pack including a plurality of N battery blocks connected in series, comprising: a plurality of (N+1) voltage detection terminals connected to the plurality of N battery blocks; a first plurality of switches each having an inter-terminal capacitance, the plurality of switches being connected to the respective voltage detection terminals connected to the battery blocks; a second switch having an inter-terminal capacitance, to which the first plurality of switches are collectively connected, the first plurality of switches being connected to odd-numbered voltage detection terminals; a third switch having an inter-terminal capacitance, to which the first plurality of switches are collectively connected, the first plurality of switches being connected to even-numbered voltage detection terminals; a pair of fourth switches connected in series to the second switch and the third switch; a capacitor provided between the connection point of the second switch and one of the fourth switches, and the connection point of the third switch and the other of the fourth switches; and a differential amplifier having input terminals to which the fourth switches are connected.

In one embodiment of the present invention, a battery voltage detection device further comprises: an A/D converter for converting the output voltage of the differential amplifier to digital value; and a computing device for processing the digital value converted by the A/D converter.

In one embodiment of the present invention, the differential amplifier uses a voltage obtained from a voltage dividing circuit as the reference voltage.

In one embodiment of the present invention, the voltage obtained from the voltage dividing circuit is output as an output of the differential amplifier.

In one embodiment of the present invention a battery voltage detection device further comprises: an A/D converter for measuring the voltage obtained from the voltage dividing circuit.

In one embodiment of the present invention, the differential amplifier has a voltage dividing circuit formed by a resistor having the same resistor value as that of a resistor which forms a gain of the differential amplifier; and the battery voltage detection device further includes an A/D converter for measuring the output of the voltage dividing circuit.

Thus, the invention described herein makes possible the advantages of providing a battery voltage detection device which is capable of detecting battery voltage with high precision and which does not reduce the cost-effectiveness.

These and other advantages of the present invention will become apparent to those skilled in the art upon reading and understanding the following detailed description with reference to the accompanying figures.

DESCRIPTION OF THE PREFERRED EMBODIMENTS

Hereinafter, an embodiment of the present invention is described with reference to the drawings.

Figure 1:
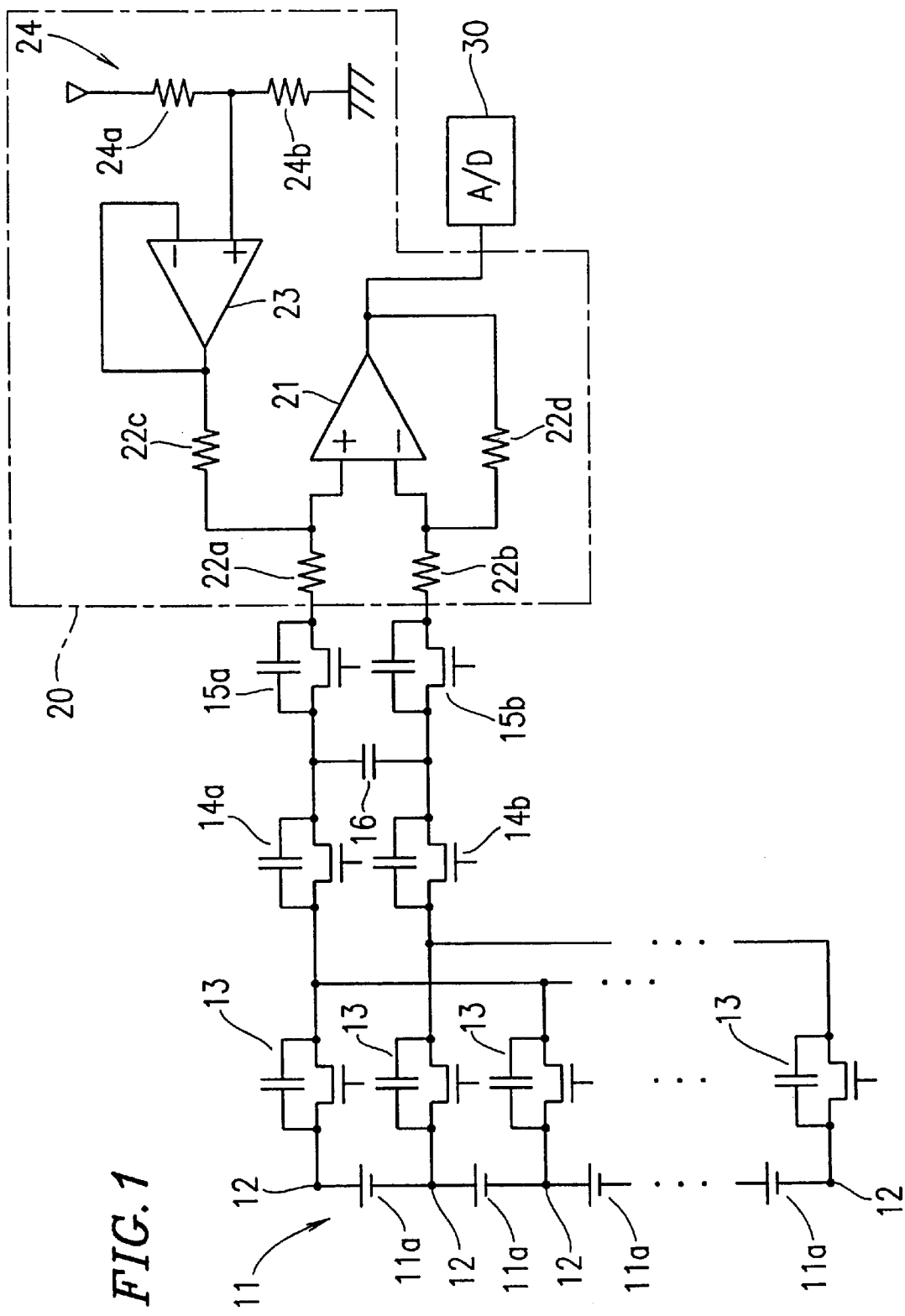
FIG. 1 shows an exemplary structure of an embodiment of a battery voltage detection device according to the present invention.

FIG. 1 shows an exemplary structure of a battery voltage detection device according to an embodiment of the present invention. The battery voltage detection devices detect the battery voltage of each of battery blocks 11a included in a high-voltage battery pack 11 mounted as an electric power supply for a motor on an electric vehicle, hybrid electric vehicle, or the like. In this specification, the battery block refers to a unit of battery cells whose voltage is detected en bloc, and includes at least one battery cell or one battery module.

In order to obtain a high voltage, a plurality of N battery blocks 11a, which are secondary batteries, are connected in series in the battery pack 11. In the battery voltage detection device, a voltage of each battery block 11a in the battery pack 11 is detected. The high-voltage battery pack 11 is isolated from the chassis earth of the vehicle so as to be in a floating state with respect to the chassis earth.

In the battery pack 11, a plurality of (N+1) voltage detection terminals 12 are provided, such that each of the voltage detection terminals 12 is located between neighboring battery blocks 11a. Each voltage detection terminal 12 is connected to one of first plurality of FETs (field-effect transistors) 13, which is a first switching element. Each of the first plurality of FETs 13 forms an SSR (solid-state relay). Some of the first plurality of FETs 13, which are connected to the odd-numbered voltage detection terminals 12 in the battery pack 11, are together connected to a second FET 14a which is a second switching element. The remainder of first plurality of FETs 13, which are connected to the even-numbered voltage detection terminals 12 in the battery pack 11, are together connected to a third FET 14b which is a third switching element.

As the second FET 14a and the third FET 14b, FETs which have inter-terminal capacitances smaller than those of the first plurality of FETs 13 are used. Each of the first plurality of FETs 13 which are connected to respective battery blocks 11a may have a large capacitance, and the inter-terminal capacitances of the first plurality of FETs 13 may vary. Thus, in light of cost-effectiveness, relatively inexpensive FETs are used as the first plurality of FETs 13.

The second FET 14a and the third FET 14b are respectively connected to fourth FETs 15a and 15b, which are fourth switching elements. A capacitor 16 is connected between the connection point of the second FET 14a and the fourth FET 15a, and the connection point of the third FET 14b and the fourth FET 15b.

The fourth FETs 15a and 15b are connected to a differential amplifier 20. The differential amplifier 20 includes a first operational amplifier 21. The fourth FET 15a and 15b are respectively connected to the positive input terminal and the negative input terminal of the first operational amplifier 21 via a first resistor 22a and a second resistor 22b. The positive input terminal of the first operational amplifier 21 receives via a third resistor 22c the output of a second operational amplifier 23 which generates a reference voltage. The output of the first operational amplifier 21 is fed back to the negative input terminal of the first operational amplifier 21 via a fourth resistor 22d. The output of the first operational amplifier 21 is output to an A/D converter 30 as the output of the differential amplifier 20.

A voltage dividing circuit 24 is a series circuit formed by resistors 24a and 24b. The potential of the connection point of the resistors 24a and 24b is input to the positive input terminal of the second operational amplifier 23 which generates a reference voltage. The output of the second operational amplifier 23 is fed back to the negative input terminal of the second operational amplifier 23.

In a battery voltage detection device having such a structure, the voltages of the battery blocks 11a in the battery pack 11 are detected in turn.

In the first step of the voltage detection process, the fourth FETs 15a and 15b connected to the differential amplifier 20 are turned off. Then, a first FET of the first plurality of FETs 13, which is connected to the first voltage detection terminal 12 in the battery pack 11, and a second FET of the first plurality of FETs 13, which is connected to the second voltage detection terminal 12 in the battery pack 11, are turned on. At the same time, the second FET 14a and the third FET 14b are turned on. Thus, the first battery block 11a is connected to the capacitor 16, and charges the capacitor 16.

After the capacitor 16 has been charged, the pair of the FETs 13 are turned off, and then the second FET 14a and the third FET 14b are turned off. Then, the fourth FETs 15a and 15b are turned on. Thus, the voltage of the capacitor 16 is applied to the differential amplifier 20.

In the differential amplifier 20, a reference voltage of 2.5 V is applied from the second operational amplifier 23 to the positive input terminal of the first operational amplifier 21 via the third resistor 22c. Therefore, the voltage of the capacitor 16, which has been input to the differential amplifier 20, is detected within a range up to 5 V from a reference of 2.5 V.

Similarly, while the fourth FET 15a and the third FET 15b are off, the first FETs 13 connected to the second voltage detection terminal 12 and the third voltage detection terminal 12 are turned on, and the second FET 14a and the third FET 14b are turned on. Then, the first FET 13, the second FET 14a, and the third FET 14b are turned off, and the fourth FETs 15a and 15b are turned on. Thus, the voltage of the second battery block 11a in the battery pack 11 is detected.

In this case, the polarity of the voltage which has been input to the first operational amplifier 21 of the differential amplifier 20 is opposite to that of the first battery block 11a. Therefore, the first operational amplifier 21 detects the voltage of the second battery block 11a within a range down to 0 V from a reference of 2.5 V.

Subsequently, the voltages of the other battery blocks 11a in the battery pack 11 are detected in turn in a similar manner.

Although the voltages having the opposite polarities are input in turn from the battery blocks 11a forming the battery pack 11 to the differential amplifier 20, the voltages are detected without switching the polarities of the reference potential of the first operational amplifier 21. The detected voltages of the battery blocks 11a are input to the A/D converter 30. In the A/D converter 30, input voltages are A/D converted, and then output to a computing unit, such as a microcomputer.

In the voltage detection device which detects the voltages of the respective battery blocks 11a as described above, even when each of the first plurality of FETs 13, which form the SSR, has a large inter-terminal capacitance, the effect caused by the large inter-terminal capacitance on the capacitor 16 can be suppressed. This is because the voltage detection device of the present invention has the following structure. The second FET 14a and the third FET 14b, which have the inter-terminal capacitances smaller than those of the first plurality of FETs 13, are connected to both ends of the capacitor 16. The second FET 14a and the third FET 14b are respectively connected to odd-numbered first FETs 13 and even-numbered first FETs 13.

Specifically, assume that the inter-terminal capacitance of each of the first plurality of FETs 13 is C1; and the inter-terminal capacitance of the second FET 14a and the third FET 14b is C2. In this case, the total capacitance C of the first plurality of FETs 13 and the second FET 14a or the third FET 14b is represented as C=C1*C2/(C1+C2). Since the inter-terminal capacitance C2 of the second FET 14a or the third FET 14b is smaller than the inter-terminal capacitance C1 of the first plurality of FETs 13, the total capacitance C can be represented by C=C2/(1+C2/C1), which is substantially equal to the inter-terminal capacitance C2 of the second FET 14a or the third FET 14b. Therefore, the effect on the capacitor 16 caused by the inter-terminal capacitance of the second FET 14a and the third FET 14b becomes smaller than the effect on the capacitor 16 caused by the inter-terminal capacitance of the first plurality of FETs 13.

Since the capacitor 16 is not directly affected by the inter-terminal capacitances of the first plurality of FETs 13, variation in the inter-terminal capacitances of the first plurality of FETs 13 does not cause a significant problem. Inexpensive FETs which have large inter-terminal capacitances can be used as the first plurality of FETs 13. In the battery pack 11, every battery block 11a is provided with a single first FET 13. Thus, using inexpensive FETs for all the first plurality of FETs 13 significantly improves cost-effectiveness.

The battery pack 11 of a high voltage is isolated from the chassis earth of the vehicle. That is, the battery pack 11 is connected to the chassis earth with a large impedance. The battery voltage of the battery pack 11 varies with respect to the chassis earth depending upon the magnitude of the load on the battery pack 11, and as a result, a common mode noise may be generated. However, even though such common mode noise is generated, the effect to the capacitor 16 can be prevented because the second FET 14a and the third FET 14b, which have the inter-terminal capacitances smaller than those of the first plurality of the first FETs 13 and which have the inter-terminal capacitances equal to each other, are connected to both ends of the capacitor 16.

In the differential amplifier 20, the voltage of the capacitor Vc is detected as displacement with respect to reference voltage Vref. The output of the differential amplifier 20, Vout, is given by the following expression.

$$Vout=Vref+Vc(R3+R4)/(R1+R2) \quad (1)$$

where Vc is the voltage of the capacitor 16, R1–R4 are resistance values of the first resistor 22a to the fourth resistor 22d in the differential amplifier 20, Vref is the reference voltage of the first operational amplifier 21.

The voltage of the capacitor 16 is compensated by a gain represented by (R3+R4)/(R1+R2), and is output as displacement with respect to reference voltage Vref. Usually, R1=R2 and R3=R4 in the differential amplifier 20. Thus, the gain is R3/R1, and expression (1) is represented as expression (2) below.

$$Vout=Vref+Vc*R3/R1 \quad (2)$$

The characteristics of the first operational amplifier 21, the second operational amplifier 22, and resistors 22a–22d, 24a and 24b may vary due to ambient temperature, deterioration, or other factors. Particularly, reference voltage Vref of the first operational amplifier 21 may be displaced from 2.5 V due to the temperature or other factors because reference voltage Vref is generated by the second operational amplifier 23 and the voltage dividing circuit 24, which is formed by a pair of the resistors 24a and 24b.

Figure 2:
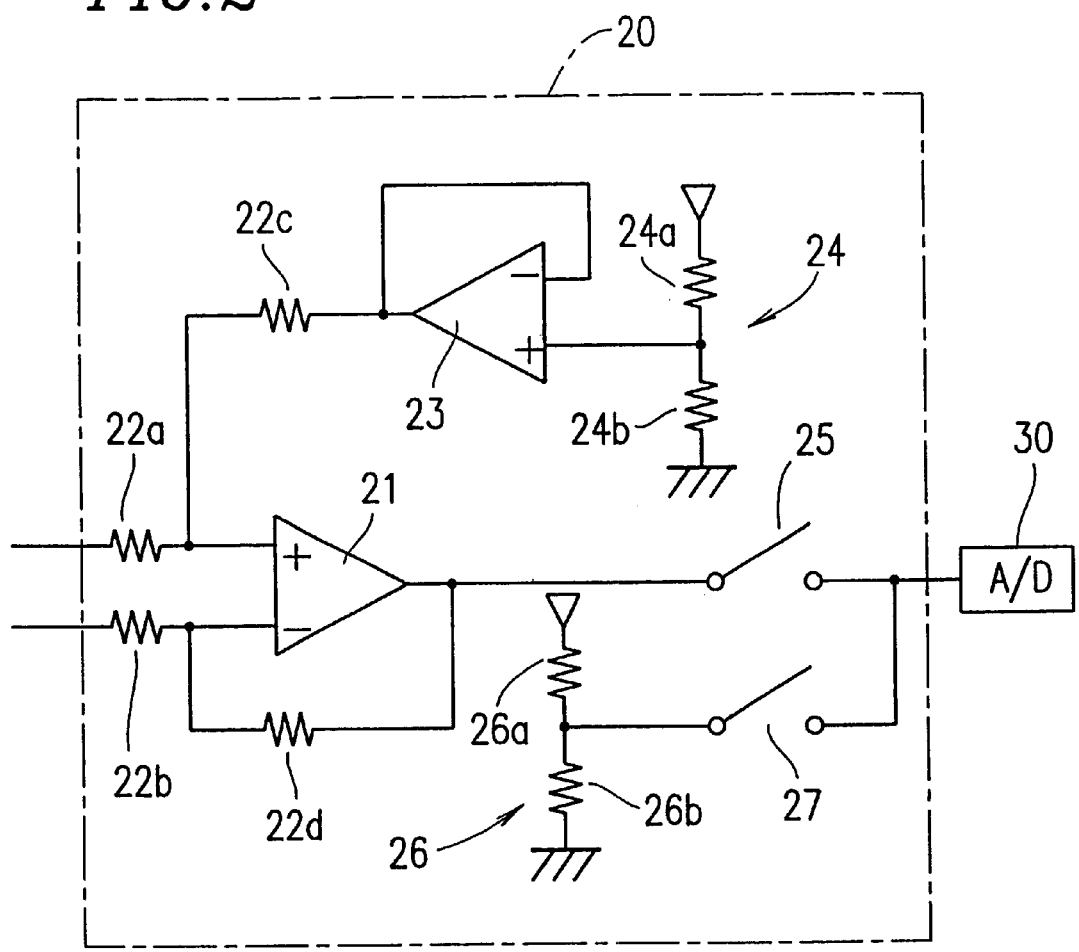
FIG. 2 shows a structure of an example of a differential amplifier used in battery voltage detection device shown in FIG. 1.
Figure 3:
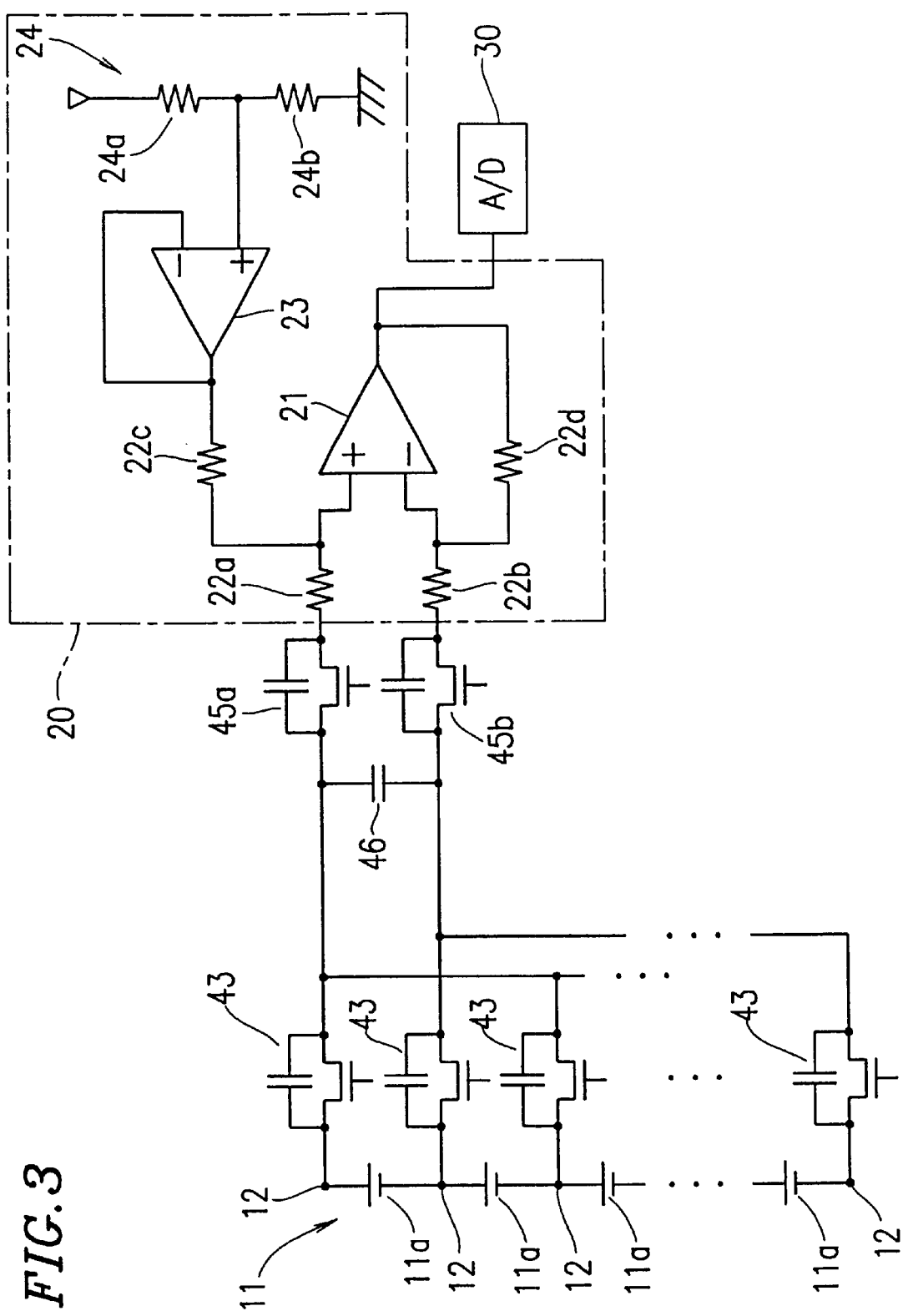
FIG. 3 shows an example of a conventional battery voltage detection device.

FIG. 2 shows the structure of an example of the differential amplifier 20 which is capable of compensating for change in output of the differential amplifier 20 due to temperature or other factors. The differential amplifier 20 of FIG. 2 is used in the battery voltage detection device of FIG. 1. The output of the first operational amplifier 21 is applied to the A/D converter 30 via a fifth switch 25. A voltage dividing circuit 26 is a series circuit formed by resistors 26a and 26b. The potential of the connection point of the resistors 26a and 26b is input to the A/D converter 30 via a sixth switch 27.

The resistance value R5 of the resistor 26a in the voltage dividing circuit 26 is equal to each of the resistance values R1 and R2 of the first and second resistors 22a and 22b (R1=R2=R5). The resistance value R6 of the other resistor 26b in the voltage dividing circuit 26 is equal to each of the resistance values R3 and R4 of the third and fourth resistors 22c and 22d (R3=R4=R6). The other elements are the same as the elements in the differential amplifier 20 provided in the battery voltage detection device of FIG. 1.

For compensating for the characteristic variation due to temperature in the differential amplifier 20 having such a structure, first, the fourth FETs 15a and 15b are turned off, and the inter-terminal capacitances of the fourth FETs 15a and 15b are sufficiently discharged. Then, the fifth switch 25 is turned on. Thus, almost no charge is input to the negative input terminal of the first operational amplifier 21. Reference voltage Vref is generated by the second operational amplifier 23 and input to the positive input terminal of the first operational amplifier 21 via the third resistor 22c. Then, reference voltage Vref is output to the A/D converter 30 through the fifth switch 25. Thus, in the A/D converter 30, a voltage corresponding to reference voltage Vref of the first operational amplifier 21 is detected.

Reference voltage Vref, which is to be input to the first operational amplifier 21, is generated by the third resistor 22c, the second operational amplifier 23, and the voltage dividing circuit 24 formed by a pair of resistors 24a and 24b. The characteristics of these resistors and the second operational amplifier 23 vary due to variation in temperature. Accordingly, reference voltage Vref detected at the A/D converter 30 changes, due to the temperature variation, with respect to reference voltage of 2.5 V.

Therefore, if the resistance values of the resistors 24a and 24b vary due to the temperature variation when the output of the differential amplifier 20 is compensated based on detected reference voltage Vref, influence caused by such a variation in resistance values can be prevented.

The output of the second operational amplifier 23 is output via the first operational amplifier 21. Therefore, the offset voltage of the first operational amplifier 21 is also detected along with the reference voltage obtained by the voltage dividing circuit 24. Thus, the offset voltage can also be compensated.

In the above structure, the output of the second operational amplifier 23 is output via the first operational amplifier 21 and the fifth switch 25. However, the output of the second operational amplifier 23 maybe directly output to the A/D converter 30 via the fifth switch 25. Furthermore, the output of the second operational amplifier 23 may be detected by an A/D converter other than the A/D converter 30 without using a switch such as the fifth switch 25. In either case, the off set voltage of the first operational amplifier 21 cannot be detected. However, voltage variation due to offset voltage, temperature, or other factors, is small, and does not cause a significant problem. In the case of using an A/D converter, it is preferable to use an A/D converter having characteristics more resistant to the temperature variation in the A/D converter itself.

Then, for compensating the characteristic variation caused due to temperature variation, the fifth switch 25 is turned off, while the sixth switch 27 is turned on. Thus, the voltage obtained by the pair of resistors 26a and 26b of the voltage dividing circuit 26 is input to the A/D converter 30. Assuming that the resistance values of the resistors 26a and 26b of the voltage dividing circuit 26 are R5 and R6, the output Vo of the voltage dividing circuit 26 is given by Va*R6/(R5+R6), where Va is the potential applied to the voltage dividing circuit 26. In this case, a voltage of 5V is applied to the voltage dividing circuit 26 as reference voltage Va for the A/D converter 30.

As described above, reference values R5 and R6 of the resistors 26a and 26b of the voltage dividing circuit 26 are respectively equal to R1 and R3. Thus, R6/R5 obtained from the output of the voltage dividing circuit 26 is equal to R3/R1 (it should be noted that the values of R3/R1 are set while taking the characteristic variation due to temperature variation into consideration). Therefore, even when the resistance values of the resistors 22a–22d used for obtaining the gain of the differential amplifier 20 vary due to the temperature variation or other factors, information on resistance values of the resistors 22a–22d can be obtained. Based on the obtained information, the gain of the differential amplifier 20 can be compensated so as to be a predetermined value.

Application of the operational amplifier 20 of FIG. 2 is not limited to the battery voltage detection device of FIG. 1. It may be used as a battery voltage detection device in which the first operational amplifier 21 is directly connected to a capacitor. Even in such a structure, by providing a fail-safe device, or a protection circuit for monitoring destruction of elements in the capacitor, the capacitor will be sufficiently discharged by the protection circuit. Thus, the reference voltage to be output from the second operational amplifier 23 can be precisely detected.

According to the battery voltage detection device of the present invention, even when each of the first plurality of switches connected to battery blocks in a battery pack has a large inter-terminal capacitance, the voltage of each of the battery blocks can be detected with a high precision without being affected by the inter-terminal capacitance. According to the present invention, switches having large inter-terminal capacitances can be used as the first plurality of switches connected to the battery blocks. Thus, cost-effectiveness can be improved.

Further, since a differential amplifier can compensate the gain and the reference voltage, the battery voltage can be detected with a higher precision even when characteristics such as resistance values vary due to a temperature variation or the like.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A battery voltage detection device for detecting voltages of battery blocks in a battery pack including a plurality of N battery blocks connected in series, comprising:

a plurality of (N+1) voltage detection terminals connected to the plurality of N battery blocks;

a first plurality of switches each having an inter-terminal capacitance, the plurality of switches being connected to the respective voltage detection terminals connected to the battery blocks;

a second switch having an inter-terminal capacitance, to which the first plurality of switches are collectively connected, the first plurality of switches being connected to odd-numbered voltage detection terminals;

a third switch having an inter-terminal capacitance, to which the first plurality of switches are collectively connected, the first plurality of switches being connected to even-numbered voltage detection terminals;

a pair of fourth switches connected in series to the second switch and the third switch;

a capacitor provided between the connection point of the second switch and one of the fourth switches, and the connection point of the third switch and the other of the fourth switches; and a differential amplifier having input terminals to which the fourth switches are connected.

2. A battery voltage detection device according to claim 1, further comprising:

an A/D converter for converting the output voltage of the differential amplifier to digital value; and a computing device for processing the digital value converted by the A/D converter.

3. A battery voltage detection device according to claim 2, wherein the differential amplifier uses a voltage obtained from a voltage dividing circuit as the reference voltage.

4. A battery voltage detection device according to claim 3, wherein the voltage obtained from the voltage dividing circuit is output as an output of the differential amplifier.

5. A battery voltage detection device according to claim 3, further comprising an A/D converter for measuring the voltage obtained from the voltage dividing circuit.

6. A battery voltage detection device according to claim 3, wherein:

the differential amplifier has a voltage dividing circuit formed by a resistor having the same resistor value as that of a resistor which forms a gain of the differential amplifier; and the battery voltage detection device further includes an A/D converter for measuring the output of the voltage dividing circuit.

* * * * *